United States Patent [19]
Buckley et al.

[11] 4,229,269
[45] Oct. 21, 1980

[54] SPRAY CELL FOR SELECTIVE METAL DEPOSITION OR REMOVAL

[75] Inventors: Reginald R. Buckley, Summit; Paul A. Kohl, Chatham, both of N.J.

[73] Assignee: Bell Telephone Laboratories, Incorporated, Murray Hill, N.J.

[21] Appl. No.: 80,401

[22] Filed: Oct. 1, 1979

[51] Int. Cl.² .............................. C25C 1/20; C25C 7/00
[52] U.S. Cl. .................................. 204/109; 204/43 G; 204/206; 204/224 R; 204/15
[58] Field of Search ............... 204/43 G, 15, 109, 202, 204/206, 207, 224 R, 222

[56] References Cited

U.S. PATENT DOCUMENTS

| | | | |
|---|---|---|---|
| 3,414,501 | 12/1968 | Kruger | 204/206 |
| 3,657,097 | 4/1972 | Baldock et al. | 204/224 R |
| 3,810,829 | 5/1974 | Oliver | 204/222 |
| 4,001,093 | 1/1977 | Koontz et al. | 204/15 |
| 4,029,555 | 6/1977 | Tezuka et al. | 204/15 |
| 4,032,414 | 6/1977 | Helder et al. | 204/224 R |
| 4,033,833 | 7/1977 | Bestel et al. | 204/15 |
| 4,069,126 | 1/1978 | Abei | 204/224 R |
| 4,162,952 | 7/1979 | Tribout | 204/206 X |

*Primary Examiner*—Arthur C. Prescott
*Attorney, Agent, or Firm*—Peter V. D. Wilde

[57] ABSTRACT

A spray plating method is shown wherein a multiplicity of spray nozzles mounted on a feed pipe direct a high velocity spray at an article to be plated. The spray is deflected onto portions of the article by metal deflectors located near the article. The deflectors serve as the anode of the plating process. This results in a high current density and a high plating rate. The method is advantageously used for hard plating gold onto connector pins or other articles on a continuous strip-plating line. In another application, metal may be selectively removed from an article. Different portions of an article may have different amounts of metal deposited or removed.

4 Claims, 4 Drawing Figures

SPRAY CELL FOR SELECTIVE METAL DEPOSITION OR REMOVAL

BACKGROUND OF THE INVENTION

1. Field of the Invention

This invention relates to an electrochemical treatment for selective metal deposition or removal.

2. Description of the Prior Art

In electrochemical plating processes, particularly those processes carried out in a continuous manner, it is desirable to deposit metal on an article as rapidly as possible. In addition, some metals are more difficult to plate rapidly than others. In particular, the deposition of gold to a usable depth is typically a more time-consuming process than plating of such metals as nickel, or other processing steps such as polishing. This implies that gold electroplating is typically the limiting factor in the processing speed of continuous strip-plating apparatus such as that described in U.S. Pat. No. 4,153,523 assigned to the same assignee as the present invention.

Furthermore, with the high cost of such metals as gold, it is necessary to limit the deposition of these metals to selected portions of many articles, such as electrical contact terminals. Various other uses are made of selective metal deposition, such as the production of circuit boards, relay contacts, etc. It is therefore desirable to have an electrochemical processing cell that can rapidly plate metals onto well-defined portions of articles.

To obtain high speed gold plating in well-defined regions, the prior art typically uses a spray nozzle which also serves as the anode and directs a spray towards a masking plate; see, for example, U.S. Pat. No. 4,029,555. It would be advantageous to further increase the plating rate of gold-plating cells that selectively define the portions of the object to be plated, while obtaining increased design freedom both for the plating cell and the article to be plated.

SUMMARY OF THE INVENTION

We have invented a method of selectively depositing or removing metal on a portion of an article by directing a high velocity spray of electrochemical processing fluid at the article. The spray is obtained from two or more spray nozzles which emit a fan-shaped spray which has a high Reynold's number. This high velocity spray intersects deflectors that are located near the article to be processed. These deflectors provide a well-defined spray on the surface of the article, and also serve as an electrode of the electrochemical process. The deflectors are located closer to the article to be processed than the nozzles that produce the spray, with the deflectors typically being less than 10 millimeters away from the article. In a preferred embodiment, the spray nozzles are mounted on a common feed pipe. More than one deflector may be used to obtain selective deposition or removal on more than one portion of an article. The electric current through individual deflectors may be varied to obtain different amounts of deposition or removal on different portions of the article.

DETAILED DESCRIPTION

The following detailed description relates to a high speed electrochemical spray processing cell for selectively electrochemically processing articles moving along a processing line. Plating and deplating of a wide variety of metals is possible. In the present invention, the functions of producing a high velocity spray and of electrically contacting the spray with an electrode are decoupled. In this manner, the physical properties of the spray may be optimized independently of the electrical properties of the spray. The present method provides a spray having both high velocity and low electrical resistance between anode and cathode, allowing for high processing rates. Selective deposition or removal may be obtained over any portion of an article. In addition, the deposition or removal rates may be varied, with different portions having different processing rates. As used herein, the term "electrochemically processing" includes both depositing and removing metal electrochemically. Further, the term "metal" includes those elements, compounds, alloys, and other substances having an electrical resistivity less than 100 microhm-cm.

Figure 1:
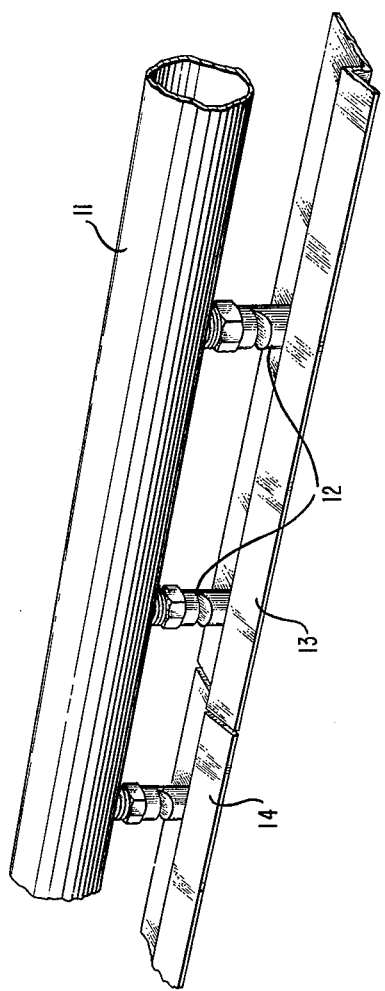
FIG. 1 shows an electrochemical processing cell having nozzles mounted on a common feed pipe and deflectors located between the nozzles and the article to be plated.

Referring to FIG. 1 spray nozzles 12 are mounted along a feed pipe 11. The spray nozzles may themselves be conventional. The nozzles used in the embodiment shown are No. ⅛ K2 from the Spraying Systems Co., which have had the orifices enlarged to 0.18 inch (0.46 cm) diameter. These spray nozzles produce a high velocity spray that is deflected by deflectors 13 and 14 onto the portion of the article to be plated. For high speed plating, the process should be operated in the so-called "turbulent" region, with the spray having a Reynold's number of at least 10,000. The Reynold's number is given approximately by the following formula for the embodiment shown:

$$Re = \frac{8 \times Q}{\pi \times D \times V}$$

where
Re = Reynold's number
D = Diameter of orifice (cm)
Q = Flow rate (cm³/sec)
V = Kinamatic viscosity (0.01 for water based plating solutions)

For the embodiment given herein, with an orifice diameter of 0.46 cm and a flow rate of 49 cm³/sec through each nozzle, the Reynold's number is approximately 27,000.

Figure 2:
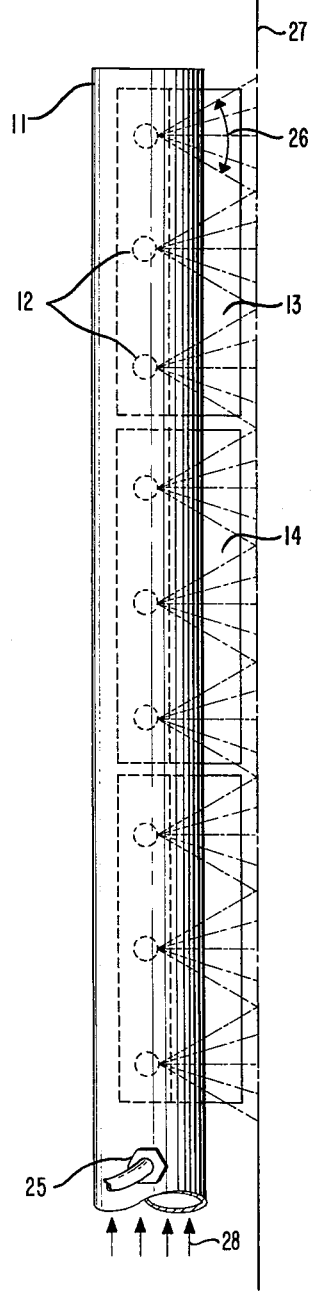
FIG. 2 shows a top view of the spray cell showing the fan-shaped spray portions emitted from the individual nozzles.

Referring to FIG. 2, it can be seen that the individual nozzles produce a fan-shaped spray having an angle of divergence 26, which is typically between 20 and 100 degrees, and is approximately 50 degrees in the preferred embodiment. Typically, the sprays of adjacent nozzles just touch at the article 27 to be plated. The divergence of the spray in a plane at right angles to that shown in FIG. 2 is typically much less, on the order of 10 degrees or less. The embodiment of FIG. 2 shows the nozzles mounted on a common feed pipe 11, through which is pumped electrochemical processing fluid 28.

Alternately, the nozzles can be fed electrochemical processing fluid through individual supply lines. The total length of the spray cell as shown in FIG. 2 is typically about two feet (0.6 mtr).

Figure 3:
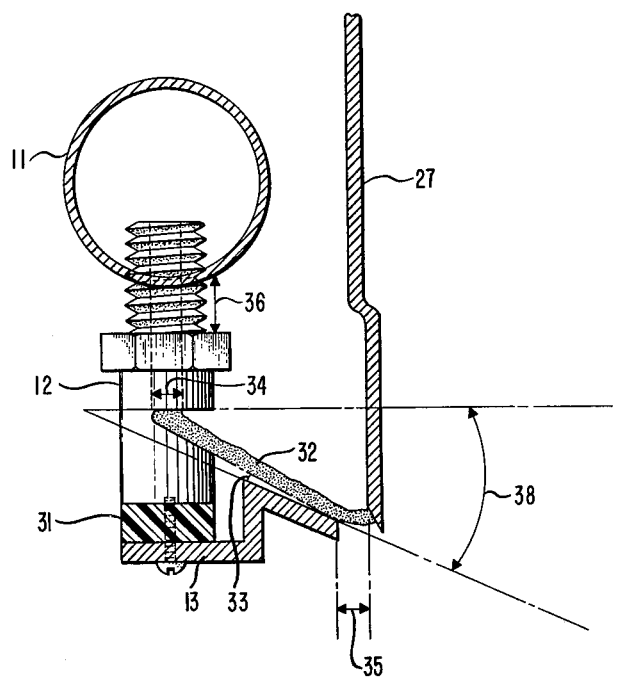
FIG. 3 shows a detailed view of the spray being emitted from an individual nozzle.

FIG. 3 shows a detailed view of a nozzle and the resulting spray. The nozzle has an orifice diameter 34, which is relatively small compared to the inside diameter of pipe 11. The inside cross-sectional area of pipe 11 should be greater than the sum of the cross-sectional areas of the orifices of the nozzles in the case of the common feed pipe. This ensures a relatively small pressure drop along a pipe on which several nozzles are attached. This helps ensure that the pressure drop along the feed pipe will be minimal, and that the spray velocity from each nozzle will be approximately the same. However, diameter 34 should be large enough to prevent clogging, with 0.05 inches (0.12 cm) being sufficient with typical spray solutions. In the preferred embodiment, diameter 34 is 0.18 inches (0.46 cm) while the inside diameter of pipe 11 is 0.62 inches (1.6 cm).

The spray 32 intersects the deflector 13 at a relatively small angle 33. This angle is less than 45 degrees and typically 5 to 10 degrees in order to minimize the reduction of the velocity of the spray due to the intersection with the deflector. The deflector both defines the portion of the article to be electrochemically processed, and serves as an electrode of the electrochemical process. In the present design, these functions are complementary, since a broad deflector close to the processed article results in both a well defined spray and a large contact area with the spray at a point close to the article. This results in low electrical resistance between the electrode and the article, while maintaining the high velocity of the spray.

The deflector 13 is typically made of a metal which has low chemical interaction with the spray. In the case of gold plating, deflector 13 is preferably made of platinum. For economy purposes, the deflector can be simply plated by platinum on the portion that intersects the spray. Nozzle 12 and pipe 11 are typically made of titanium, which has low interaction with gold-plating sprays, and good mechanical stability. Other noncorroding materials, including plastics, may be used for the pipe and nozzles.

Although various gold plating solutions are useful in this apparatus and process, one particular composition is especially suitable because it permits rapid plating with excellent plating results. The plating composition comprises 16–20 gm/liter gold as $KAu(CN)_2$, 65–86 parts per million cobalt as cobalt citrate and a citrate buffering system with the pH of the solution at approximately 4. The buffering system is conveniently made by adding 100 gm/liter citric acid and 50 gm/liter KOH to the electroplating solution.

Figure 4:
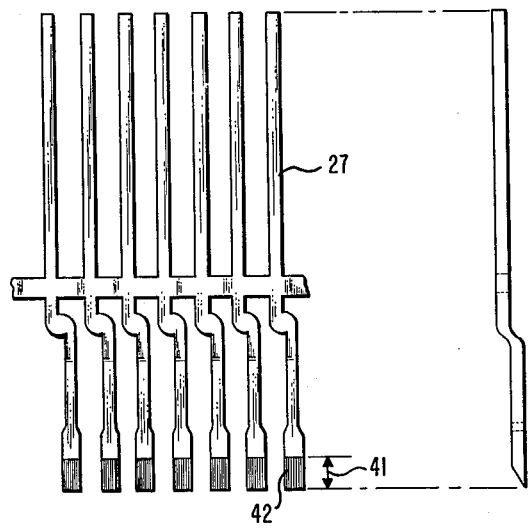
FIG. 4 shows a typical plated article.

A small portion, approximately 50 milliinches (1.3 mm) wide, is plated by each deflector in the embodiment shown. To obtain a larger plated area, multiple deflectors may be utilized to plate adjacent or non-adjacent portions. By plating three adjacent portions, the embodiment of FIG. 1 achieves a total plated portion 42 having a width 41 of 150 milliinches (3.8 mm) on connector terminal 27; see FIG. 4. In order to plate different portions, the deflectors may be moved by changing the width of spacer 31 or by changing the angle of deflection 38. The distance 36 from the nozzle to the feed pipe may also be changed.

As further shown in FIG. 2, if the feed pipe 11 is metallic, electrical contact to the deflectors may simply be made by connection 25 to the feed pipe itself. Unless special steps are taken to insulate the deflectors or nozzles they will all be at the same electrical potential with respect to the plated article. If the deflectors were also otherwise equivalent, this would result in substantially the same amount of metal deposition resulting from each deflector. However, it would also be possible to insulate the deflectors from each other and place each at a different electrical potential with respect to the plated article. This would cause more current to pass through one deflector as compared to another, and would result in a higher plating rate from the one deflector.

Even if all the deflectors are at the same potential, it is possible to obtain a greater current and hence a greater plating rate from a given deflector. One method is by making one deflector longer than another deflector. It is also possible to place one deflector closer to the plated article than another deflector, thereby decreasing the electrical resistance. In any case, distance 35 of FIG. 3 is less than 10 millimeters to obtain a low electrical resistance and a high plating rate, and is typically 3 to 4 millimeters in the embodiment shown.

In a typical gold-plating system, having 9 nozzles, the gold-plating solution is typically pumped at a rate of 7 gallons per minute (442 $cm^3$/sec) through pipe 11, or 49 $cm^3$/sec through each nozzle 12. The current density on the connector pins being plated is approximately 0.5 amps/$cm^2$ with an applied voltage of 10 volts between the deflectors (anode) and the plated pins (cathode). This allows plating on the area 42 of pin 27 at a depth of approximately 120 microinches (3 microns) with the plated pins moving at speeds of approximately 12 feet (3.6 mtr) per minute past the spray plating cell.

The present spray plating method is preferably practiced in many cases in enclosed spray cells along a continuous processing line such as that shown in U.S. Pat. No. 4,153,523, assigned to the same assignee as the present invention. The same principles that allow high speed gold plating also allow high speed plating of other metals. The gold electroplating cell may be followed by a blow-off section and often by a rinse cell. Typically, other cells proceed and follow the gold electroplating cell which carry out various electrochemical procedures such as cleaning, electropolishing, etc. One typical arrangement has first a nickel plating cell, then a flash gold plating cell and then the hard gold plating cell. Another typical case uses a hard gold plating cell only. These various cells may have blow-off sections and rinse cells interposed at various locations along the strip line to minimize contamination between cells.

In addition, by interchanging the anode and the cathode (by reversing the electrical polarity on the deflectors and the article) a deplating operation may be obtained wherein selected regions of an article may have metal removed. The electrochemical processing fluid would normally be different than that used for plating, however. The high velocity spray and low electrical resistance embodied in the present invention are advantageously employed in the removal case also, which is included in the present invention. Although an article to be plated is itself typically conductive, this need not be the case. For example, a substantially non-conducting article may have a conducting surface coating, metallic or otherwise, which allows the article to serve as an electrode of the plating process. All such variations and deviations which basically rely on the teachings through which this invention has advanced the art are properly considered to be within the spirit and scope of this invention.

We claim:

1. A method of manufacturing an article including the step of selectively electrochemically processing a portion of the article by steps comprising directing at the article a spray of electrochemical processing fluid, with the article being a first electrode of the electrochemical process, and the spray conducting electric current between said first electrode and a second electrode of the electrochemical process, the invention CHARACTERIZED in that said spray comprises two or more fan-shaped spray portions produced by two or more spray nozzles, with said spray having a Reynold's number of at least 10,000, and further characterized in that said second electrode comprises one or more deflectors that intersect said spray at an included angle less than 45 degrees and thereby deflect the spray onto the portion of the article to be selectively processed, with the deflectors extending to a point closer than 10 millimeters from the portion of the article to be selectively processed.

2. The invention of claim 1 FURTHER CHARACTERIZED in that said spray nozzles are mounted on a common feed pipe, with the inside cross-sectional area of said feed pipe being greater than the sum of the cross-sectional areas of the orifices of said nozzles.

3. The invention of claims 1 or 2 FURTHER CHARACTERIZED in that two or more deflectors are used, with a first deflector deflecting said spray onto a first portion of said article, and at least one other deflector deflecting said spray onto a second portion of said article.

4. The invention of claim 3 FURTHER CHARACTERIZED in that the amount of electric current conducted through said first deflector is substantially different from the amount of electric current conducted through at least one other of said deflectors, thereby producing a substantial difference in the degree of electrochemical processing of said first portion as compared to said second portion.

* * * * *